(12) United States Patent
Torrisi

(10) Patent No.: US 9,406,484 B2
(45) Date of Patent: Aug. 2, 2016

(54) SPECIMEN HOLDER FOR HOLDING A SEMICONDUCTOR DEVICE DURING A SAMPLE PREPARATION PROCEDURE CARRIED OUT USING FIRST AND SECOND SAMPLE PREPARATION APPARATUSES

(75) Inventor: Marco Alfio Torrisi, Aci Sant'Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 391 days.

(21) Appl. No.: 13/597,057

(22) Filed: Aug. 28, 2012

(65) Prior Publication Data

US 2014/0061502 A1    Mar. 6, 2014

(51) Int. Cl.
*H01J 37/20* (2006.01)
*H01J 37/305* (2006.01)

(52) U.S. Cl.
CPC ..... *H01J 37/3056* (2013.01); *H01J 2237/2007* (2013.01); *H01J 2237/31745* (2013.01)

(58) Field of Classification Search
CPC .... H01J 49/20; H01J 2237/2007; H01J 37/20
USPC ...................................... 250/449.11, 442.11
See application file for complete search history.

(56) References Cited

U.S. PATENT DOCUMENTS

| | | | | |
|---|---|---|---|---|
| 5,043,144 | A * | 8/1991 | Gordon et al. | 422/561 |
| 6,872,955 | B1 * | 3/2005 | Balcome et al. | |
| 7,479,399 | B1 * | 1/2009 | Johnson et al. | 438/33 |
| 8,288,737 | B1 * | 10/2012 | Walck | 250/440.11 |
| 2006/0169923 | A1 * | 8/2006 | Yamashita | 250/492.21 |
| 2009/0014648 | A1 * | 1/2009 | Zeile et al. | 250/306 |
| 2009/0242796 | A1 * | 10/2009 | Hirano et al. | 250/442.11 |

* cited by examiner

*Primary Examiner* — Phillip A Johnston
*Assistant Examiner* — Eliza Osenbaugh-Stewar
(74) *Attorney, Agent, or Firm* — Seed IP Law Group PLLC

(57) ABSTRACT

A specimen holder is configured to hold, during a sample preparation procedure carried out using first and second sample preparation apparatuses, a semiconductor device to be analyzed using an electron microscope. The specimen holder includes a holding portion having a support configured to support the semiconductor device; and a supporting portion configured to releasable support the holding portion. The supporting portion includes an engaging element configured to couple the specimen holder into the first and second sample preparation apparatuses during the sample preparation procedure, and a guide configured to enable the holding portion to slide within the guide and vary a position of the holding portion with respect to the supporting portion.

18 Claims, 9 Drawing Sheets

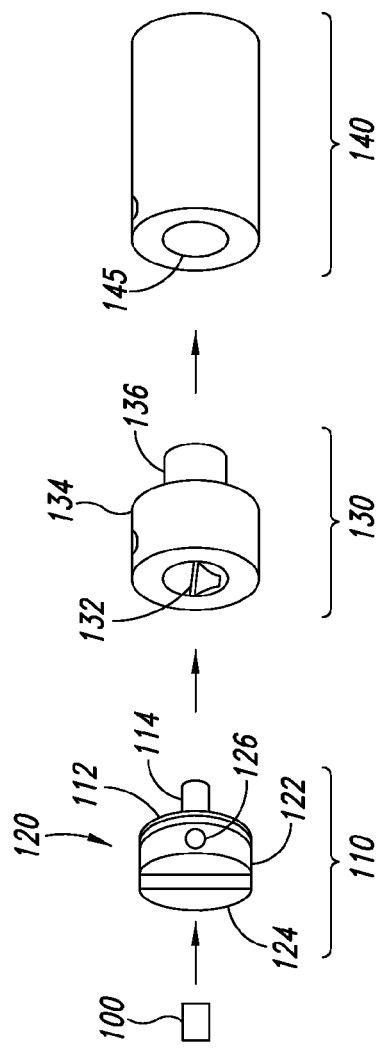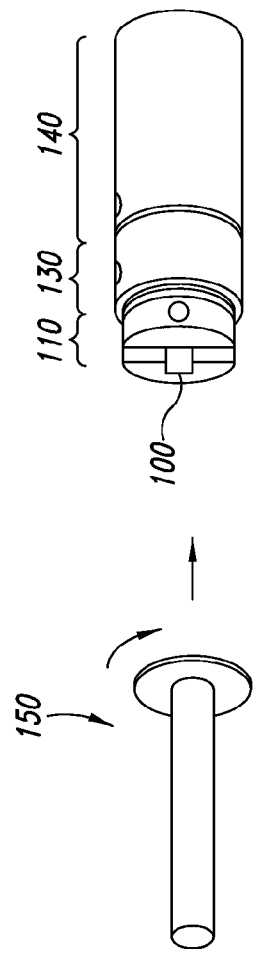
FIG. 1A (Prior Art)
FIG. 1B (Prior Art)

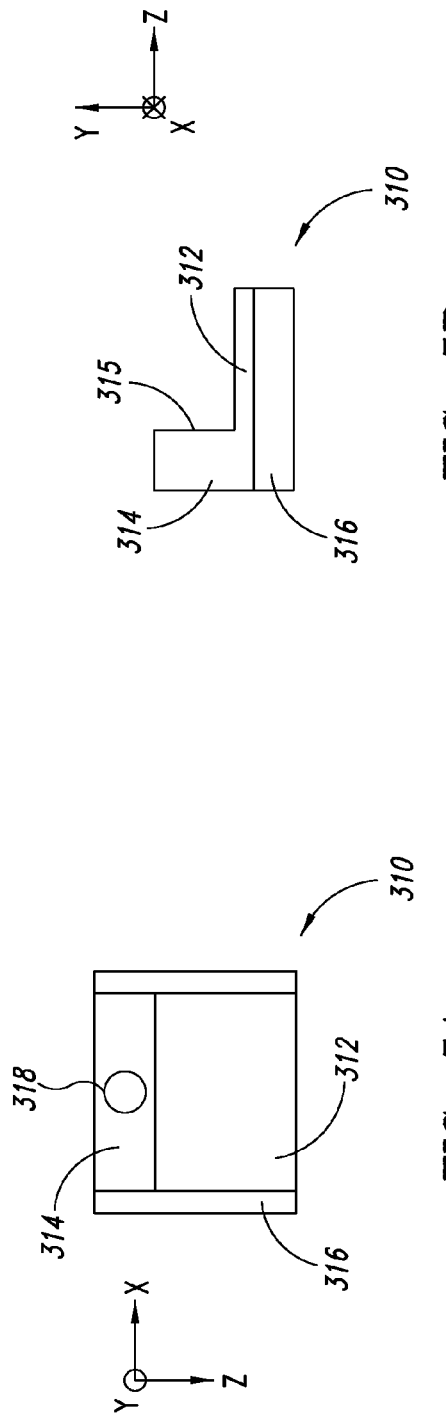

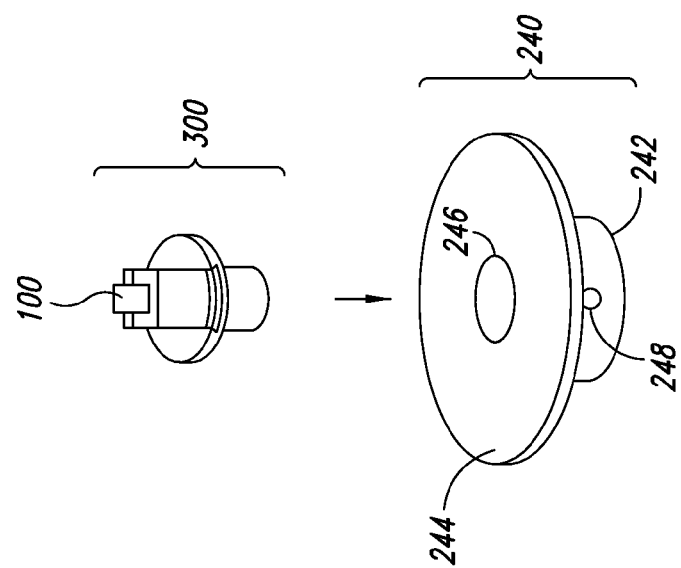

SPECIMEN HOLDER FOR HOLDING A SEMICONDUCTOR DEVICE DURING A SAMPLE PREPARATION PROCEDURE CARRIED OUT USING FIRST AND SECOND SAMPLE PREPARATION APPARATUSES

BACKGROUND

1. Technical Field

The present disclosure relates to the preparation of samples for electron microscopes.

2. Description of the Related Art

Electron microscopy provides significantly higher resolution and greater depth of focus than optical microscopy.

In a scanning electron microscope (also referred to as "SEM"), a primary electron beam is focused to a fine spot that scans the surface to be observed. Secondary electrons are emitted from the surface as it is impacted by the primary beam. The secondary electrons are detected, and an image is formed, with the brightness at each point of the image being determined by the number of secondary electrons detected when the beam impacts a corresponding spot on the surface.

In a transmission electron microscope (also referred to as "TEM"), a broad beam impacts the sample and electrons that are transmitted through the sample are focused to form an image of the sample. The sample is sufficiently thin to allow many of the electrons in the primary beam to travel though the sample and exit on the opposite site.

Samples typically are pre-processed (generally referred to as "sample preparation") to be suitably viewed under an electron microscope. Sample preparation strongly depends on the sample type and the desired analysis.

Specifically, if the sample is or includes an electronic semiconductor device, such as for example an electronic circuit integrated in a chip made in a semiconductor material (e.g., silicon), the sample preparation may provide for the execution of target surfacing operations, followed by a ion beam milling operation. The target surfacing operations exploit mechanical tools for milling, sawing, drilling, groundings and/or polishing the semiconductor device, while the ion beam milling operation uses high energy ion bombardment to remove material or modify the surface of the semiconductor device. These operations may be performed directly on the chip as such (naked chip) or with the chip embedded in a package.

The target surfacing operations and the ion beam milling operation are typically carried out by means of two different apparatuses. For example, the target surfacing operations may be carried out by a target surfacing apparatus such as the Leica EM TXP®, while the ion beam milling operations by a ion beam milling apparatus such as the Leica EM RES101®.

According to a solution known in the art, a sample preparation of a semiconductor device provides the following operations.

Firstly, as illustrated in FIG. 1A, the semiconductor device, identified with the reference 100, is inserted in the target surfacing apparatus for being subjected to targeting surfacing operations.

In order to insert the semiconductor device 100 in the target surfacing apparatus, the semiconductor device 100 is coupled with a specimen holder. The specimen holder comprises a stub member 110 including a substantially flat support element 112 with a face centrally provided with a protruding pin element 114. A clamp element 120 adapted to hold the semiconductor device 100 is provided on the other face of the support element 112. The clamp element 120 comprises in turn two faced jaw members 122, 124, each one provided with a respective threaded hole 126 rotatably housing a corresponding set screw (not illustrated in the figures). In an open configuration, the clamp element 120 has the two faced jaw members 122, 124 which are spaced apart from each other. The clamp element 120 is brought to a closed configuration by tightening the set screws so as to force the jaw members 122, 124 toward each others. The semiconductor 100 is inserted within the free space between the two jaw members 122, 124 when the clamp element 120 is in the open configuration, and then the set screws are tightened to bring the clamp element 120 in the closed configuration so that the semiconductor device 100 is held between the jaw members 122, 124 through the application of inward pressure.

The stub member 110 is then coupled—e.g., through a proper adapter member 130—to a pivot arm 140 of the target surfacing apparatus. The adapter member 140 comprises a further clamp element 132 adapted to be opened/closed by tightening/loosing a set screw (not illustrated in the figures) rotatably housed in a threaded hole 134, and a protruding pin element 136. The stub member 110 is coupled with the adapter member 130 by clamping the pin element 114 of the former in the clamp element 132 of the latter. The stub-adapter assembly is then coupled to the pivot arm 140 of the target surfacing apparatus by inserting the protruding pin element 136 of the adapter member 130 into a corresponding opening 145 of the pivot arm 140.

As illustrated in FIG. 1B, the semiconductor device 100 is then processed by exploiting one or more mechanical tools 150 of the target surfacing apparatus, such as for example rotating diamond and tungsten carbide millers, diamond disc cutters and/or lapping inserts. When the processing operations carried out by means of the mechanical tools 150 are ended, the stub member 110 is removed from the pivot arm 140, and then the semiconductor device 100 is released from the clamp element 120.

Afterward, as illustrated in FIG. 2A, the semiconductor device 100 is inserted in the ion beam milling apparatus for being subjected to ion beam milling operations.

For this purpose, the semiconductor device 100 is coupled with a new specimen holder including a stub member 210 substantially similar to the stub member 110. The stub member 210 includes a substantially flat support element 212 having a face centrally provided with a protruding pin element 214. A clamp element 220 adapted to hold the semiconductor device 100 is provided on the other face of the support element 212. The clamp element 220 comprises in turn two faced jaw members 222, 224, each one provided with a respective threaded hole 226 rotatably housing a corresponding set screw (not illustrated in the figures). The semiconductor 100 is inserted within the free space between the two jaw members 222, 224 when the clamp element 220 is in the open configuration, and then the set screws are tightened to bring the clamp element 220 in the closed configuration so that the semiconductor device 100 is held between the jaw members 222, 224 through the application of inward pressure.

The stub member 210 is then coupled—e.g., through a proper adapter member 230—in a working support member 240 designed to be housed in the ion beam milling apparatus. The adapter member 230 comprises an upper support portion 232 provided with a hole 234 for receiving the pin element 214 of the stub member 210, and a protruding engaging element 236. A threaded hole 238 is provided on the support portion 232 for rotatably housing a set screw (not illustrated in figure) adapted to fasten the stub member 210 to the adapter member 230 when the pin element 214 is inserted in the hole 234.

The working support member 240 comprises an hollow cylindrical base element 242 whose top edge is surrounded by a handling ring element 244 that protrudes transversally to the side surface of the base element 242. An opening 246 crosses the base element 242 from the top to the bottom edges thereof. The stub-adapter assembly is coupled with the working support member 240 by fitting the engaging element 236 of the former into the opening 246 of the latter. A threaded hole 248 is provided on the side surface of the base element 242 for housing a set screw (not illustrated) which is adapted to be tightened for fastening the stub-adapter assembly to the working support member 240 when the engaging element 236 is fitted in the opening 246.

In a calibration phase directed to set the working distance for the subsequent ion beam milling operation, the stub-adapter assembly is fitted in the working support member 240 with the set screw housed in the hole 248 that is loose, in such a way that the engaging element 236 is completely inserted in the opening 246; then, by grabbing the handling ring element 244, the stub-adapter-support is inserted in a calibration apparatus (not illustrated) having an arrangement for pushing upwards the engaging element 236 (and thus, the stub-adapter assembly) within the opening 246 until the stub-adapter assembly is displaced with respect to the support member 240 by a desired working distance. Once the desired working distance has been reached, the set screw housed in the hole 248 is tightened in such a way that the relative distance between the stub-adapter assembly and the support member (corresponding to the desired working distance) is maintained also when the stub-adapter-support is taken out from the calibration apparatus, as illustrated in FIG. 2B.

At this point, the stub-adapter-support assembly is inserted in a pre-chamber (not illustrated) of the ion beam milling apparatus, wherein vacuum is generated. Once vacuum is generated, such assembly is brought to the main chamber (not illustrated) of the apparatus, wherein the semiconductor device is targeted by ion beams.

After the sample preparation operations are terminated, the semiconductor device may be analyzed using the electron microscope. For this purpose, the semiconductor device is inserted in a specimen holder, such as for example one of the stubs used in the target surfacing apparatus and in the ion beam milling apparatus. Such specimen holder is fitted into a pre-chamber of the electron microscope, wherein vacuum is generated. Then, the specimen holder is brought to the main chamber of the microscope, wherein the semiconductor device is analyzed by means of electron beams.

The known procedure described above requires that the semiconductor device is coupled and released to/from different specimen holders at different times. In fact, the sample preparation firstly couples the semiconductor device to the specimen holder of the target surfacing apparatus, and then to the specimen holder of the ion beam milling apparatus. Moreover, in order to analyze the semiconductor device through the electron microscope, the semiconductor device is inserted in a further specimen holder.

BRIEF SUMMARY

The Applicant has observed that a such procedure is disadvantageous, since each time the semiconductor device is re-inserted in a new specimen holder, relocation errors—such as displacement errors and tilt angle errors—may occur, negatively affecting the correct outcome of the analysis.

Moreover, the specimen holders described above include clamp elements comprising two faced jaw members. In an open configuration, the clamp element has the two faced jaw members which are spaced apart from each other. By placing the semiconductor device in the free space between the jaw members and by tightening set screws provided in each jaw member, the jaw members are forced toward each others until clamping the semiconductor device.

The Applicant has further observed that using specimen holders of this type is disadvantageous, since in case the semiconductor device to be analyzed is provided with a package, the free space between the jaw members may not be sufficient to house the semiconductor device itself when the clamp element is in the open configuration. For example, specimen holders presently available on the market have clamp elements capable of clamping semiconductor devices having a package thickness of at most 1 mm.

On the other hand, since the compression force exerted on the semiconductor device by each jaw member (when the clamp element is in the closed configuration) is concentrated in small portions of the semiconductor device, and particularly at semiconductor device portions corresponding to the locations of the set screws in the jaw members, if the semiconductor device is in the naked chip form, and the chip itself is quite thin (e.g., having a thickness of 100 µm or less), such compression force may cause the semiconductor device to break.

One embodiment of the present disclosure is a specimen holder configured to hold, during a sample preparation procedure carried out using first and second sample preparation apparatuses, a semiconductor device to be analyzed through an electron microscope. The specimen holder includes a holding portion having a support configured to support the semiconductor device; and a supporting portion configured to releasably support the holding portion. The supporting portion includes an engaging element configured to couple the specimen holder into the first and second sample preparation apparatuses during the sample preparation procedure, and a guide configured to enable the holding portion to slide within the guide and vary a position of the holding portion with respect to the supporting portion.

BRIEF DESCRIPTION OF THE SEVERAL VIEWS OF THE DRAWINGS

These and other features and advantages of the present disclosure will be better understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In particular, it is expressly understood that the figures are not necessarily drawn to scale (with some details that could be exaggerated and/or simplified) and that, unless otherwise indicated, they are simply used for conceptually illustrating the described structures and procedures. In particular:

FIGS. 1A and 1B illustrate how a semiconductor device is inserted in a target surfacing apparatus according to a solution known in the art;

FIGS. 5A-5C are further views of the holding portion of FIG. 4A;

FIG. 8 illustrates how a semiconductor device is inserted in a ion beam milling apparatus exploiting the specimen holder of FIG. 3 according to an embodiment of the present disclosure.

DETAILED DESCRIPTION

Figure 3:
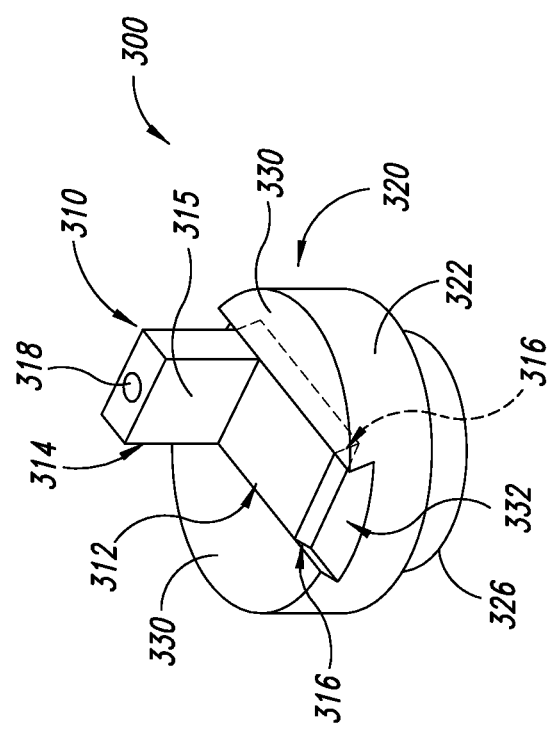
FIG. 3 is a perspective view of a specimen holder according to an embodiment of the present disclosure.

With reference to the drawings, FIG. 3 is a perspective view of a specimen holder 300 adapted to hold a semiconductor device 100 during sample preparation operations according to an embodiment of the present disclosure. The specimen holder 300 comprises a holding portion 310 adapted to be slidingly engaged in a supporting portion 320.

Figure 4B:
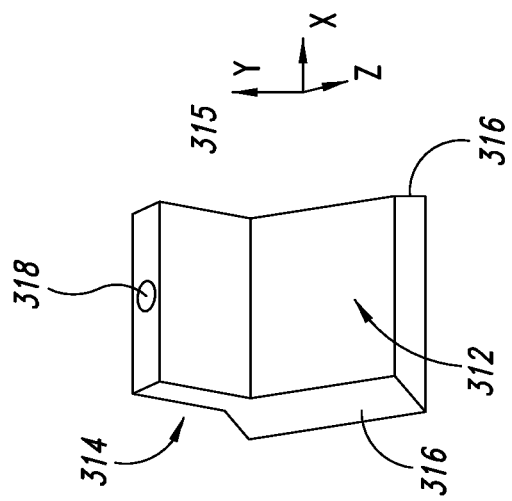
FIG. 4B is a perspective view of a supporting portion of the specimen holder of FIG. 3 according to an embodiment of the present disclosure.
Figure 4A:
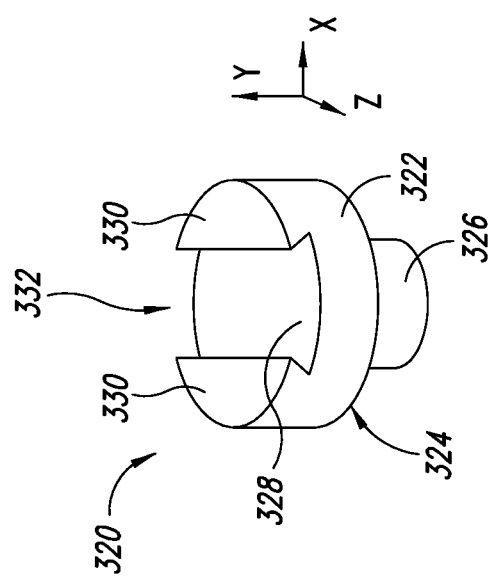
FIG. 4A is a perspective view of a holding portion of the specimen holder of FIG. 3 according to an embodiment of the present disclosure.

FIGS. 4A and 4B are perspective views of the holding portion 310 and the supporting portion 320, respectively, when disengaged one from the other.

Figure 6B:
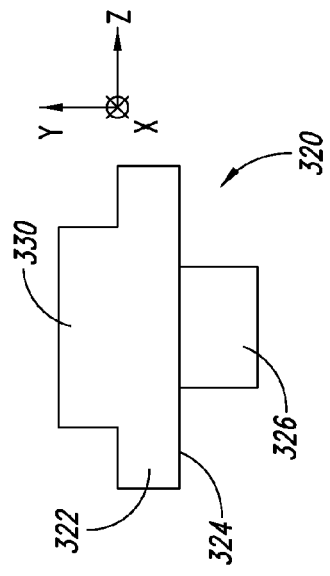
FIGS. 6A-6B are further views of the supporting portion of FIG. 4B.
Figure 6C:
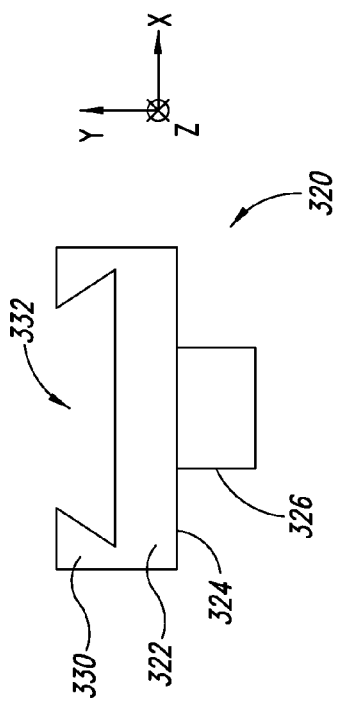
Figure 6A:
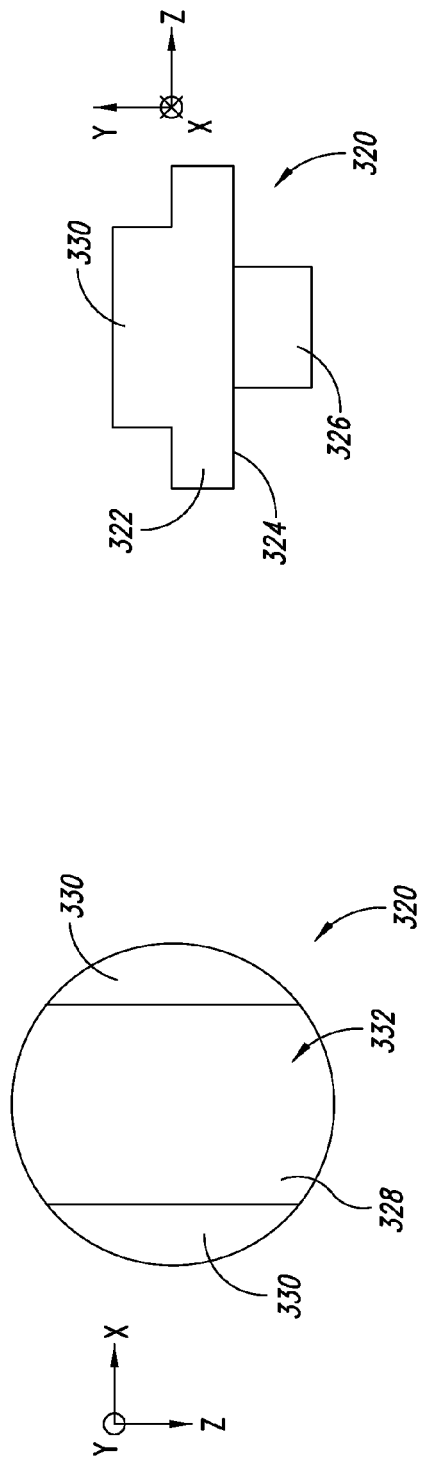

Making reference to the directions x, y and z illustrated in the figures, FIG. 5A depicts the holding portion 310 viewed from a plane parallel to the directions x and z, FIG. 5B depicts the holding portion 310 viewed from a plane parallel to the directions y and z, and FIG. 5C depicts the holding portion 310 viewed from a plane parallel to the directions y and x. FIG. 6A depicts the supporting portion 320 viewed from a plane parallel to the directions x and z, FIG. 6B depicts the supporting portion 320 viewed from a plane parallel to the directions y and z, and FIG. 6C depicts the supporting portion 320 viewed from a plane parallel to the directions y and x.

According to an embodiment of the present disclosure, the holding portion 310 includes a first flat element 312 (e.g., having substantially the shape of a parallelepiped) extending along a plane parallel to the directions x and z, and a second element 314 (e.g., having substantially the shape of a parallelepiped) extending along the y direction from an edge of the first element 312, so that the section of the holding portion 310 taken along the yz plane exhibits an "L" shape. As will be described in the following of the present description, the face of the second element 314 which intersects the first element 312, referred to as support face and identified in the figures with the reference 315, is configured to support the semiconductor device 100 to be prepared for the electron microscope analysis. Each one of the two side edges of the first element 312 extending along the direction z is provided with a respective slanted engaging member 316, in order to make the holding portion 310 adapted to slide within a corresponding guide located in the supporting portion 320 (as will be described in the following). A threaded hole 318 adapted to rotatably house a set screw (not visible in the figures) extends along the direction y from a top face to a bottom face of the second element 314. The holding portion 310 is made of a conductive material with a high hardness, such as steel.

According to an embodiment of the present disclosure, the supporting portion 320 comprises a flat base element 322 (e.g., having a substantially cylindrical shape) lying along a plane parallel to the directions y and z. The base element 322 has a bottom face 324 centrally provided with a protruding engaging element 326 (e.g., having a substantially cylindrical shape) extending parallel to the direction y, and an upper face 328 provided with two protruding guide members 330 defining a dovetail guide 332 extending along the direction z. The engaging element 326 has a diameter such to fit the opening 246 of the support member 240 of the ion beam milling apparatus (see FIG. 2A). The supporting portion 320 is made of a conductive hard material, such as brass.

According to an embodiment of the present disclosure, the sample preparation of the semiconductor device 100 exploiting the specimen holder 300 provides the following operations.

The two portions forming the specimen holder 300, i.e., the holding portion 310 and the supporting portion 320, are initially disengaged one from another.

The semiconductor device 100 is firstly attached to the support face 315 of the holding portion 310, for example by gluing through a carbon double-sided tape.

Afterward, the specimen holder 300 is reassembled by fitting the holding portion 310 in the supporting portion 320. For this purpose, the slanted engaging members 316 of the holding portion 310 are slid (along the z direction) into the dovetail guide 332 of the supporting portion 320. The set screw located in the threaded hole 318 is then tightened to constrain the holding portion 310 to the supporting portion 320.

Figure 7:
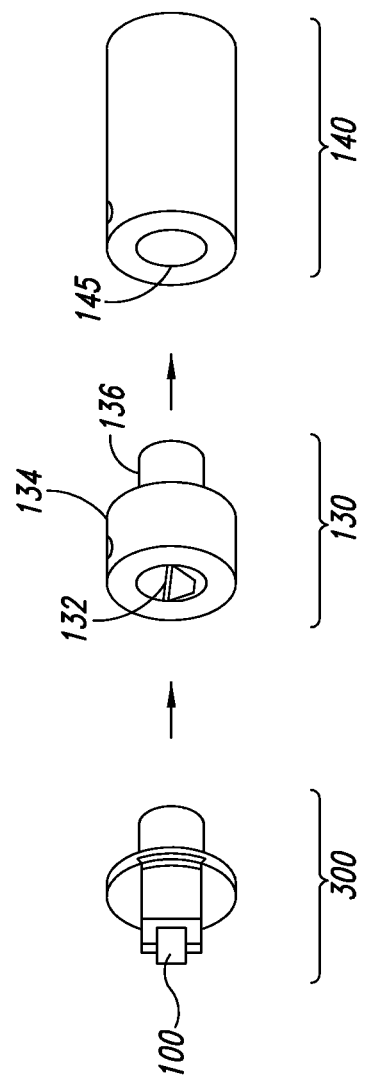
FIG. 7 illustrates how a semiconductor device is inserted in a target surfacing apparatus exploiting the specimen holder of FIG. 3 according to an embodiment of the present disclosure.

As illustrated in FIG. 7, the specimen holder 300 is then used to insert the semiconductor device 100 in the target surfacing apparatus in place of the stub member 110 (see FIG. 1A). For this purpose, the specimen holder 300 is coupled with the adapter member 130 by clamping the engaging element 326 of the former in the clamp element 132 of the latter. The specimen holder-adapter assembly is then coupled to the pivot arm 140 of the target surfacing apparatus by inserting the protruding pin element 136 of the adapter member 130 into a corresponding opening 145 of the pivot arm 140.

The semiconductor device 100 is then processed by exploiting the mechanical tools of the target surfacing apparatus. When the processing operations carried out by means of the mechanical tools are ended, the specimen holder 300 is disconnected from the adapter member 130 for being extracted from the target surfacing apparatus.

Instead of detaching the semiconductor device 100 from the specimen holder 300 and then repositioning it into another specimen holder to be used in the ion beam milling apparatus, according to an embodiment of the present disclosure, the semiconductor device 100 is left on the specimen holder 300, and such specimen holder 300 is directly coupled within the ion beam apparatus.

Figure 2B:
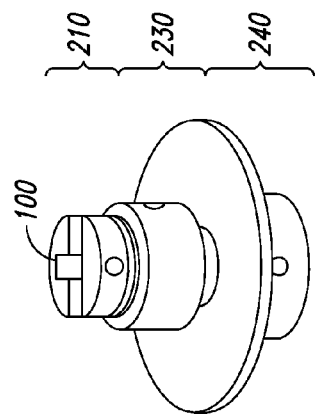
FIGS. 2A and 2B illustrated how a semiconductor device is inserted in a ion beam milling apparatus according to a solution known in the art.
Figure 2A:
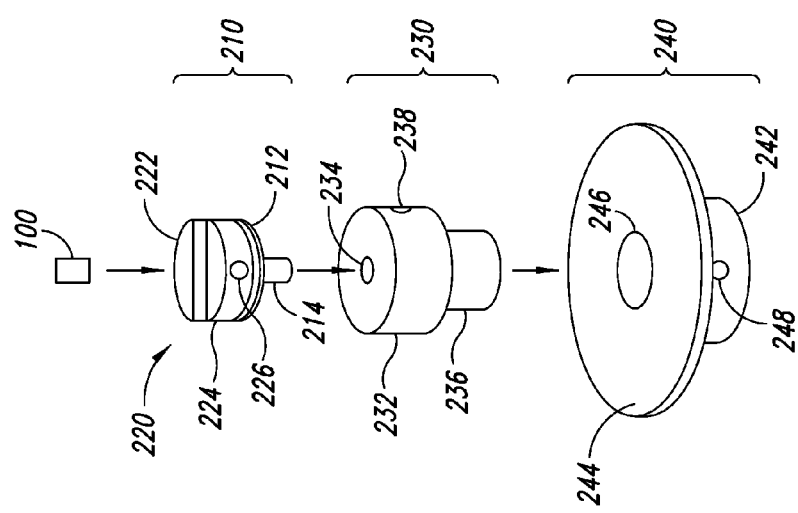

Particularly, according to an embodiment of the present disclosure illustrated in FIG. 8, the specimen holder 300 is used to insert the semiconductor device 100 in the ion beam milling apparatus in place of both the stub member 210 and the adapter member 230 (see FIG. 2A). For this purpose, the specimen holder 300 is directly coupled with the working support member 240 by fitting the engaging element 326 of the former into the opening 246 of the latter.

The calibration phase directed to set the working distance for the subsequent ion beam milling operation is carried out by fitting the specimen holder 300 into the working support member 240 while the set screw housed in the hole 248 is loose, in such a way that the engaging element 326 is completely inserted in the opening 246, with the bottom face 324 of the base element 322 that rests upon the handling ring element 244; then, by grabbing the handling ring element 244, the specimen holder-support is inserted in the calibration apparatus (not illustrated) provided with an arrangement for pushing upwards the engaging element 236 (and thus, the specimen holder 300) within the opening 246 until the specimen holder 300 is displaced with respect to the support member 240 by the desired working distance. Once the desired working distance has been reached, the set screw housed in the hole 248 is tightened in such a way that the relative distance between the specimen holder 300 and the support member (corresponding to the desired working distance) is maintained also when the stub-adapter-support is taken out from the calibration apparatus. At this point, the specimen holder-support assembly is inserted in the pre-chamber of the ion beam milling apparatus, wherein vacuum is generated. Once vacuum is generated, such assembly is brought to the main chamber of the apparatus, wherein the semiconductor device is targeted by ion beams.

Compared to the known solutions, using the specimen holder 300 according to the embodiments of the present disclosure provides several advantages.

Indeed, since with the proposed specimen holder the semiconductor device does not need to be removed from a first specimen holder (for the target surfacing apparatus) in order to be reinserted in a new specimen holder (for the ion beam milling apparatus), both displacement errors and tilt angle errors are avoided.

Moreover, since according to the present disclosure the semiconductor device is attached to the holding portion of the specimen holder by gluing, the disadvantages of the known solutions, that provide instead for clamping the semiconductor device between jaw members, are also avoided. Indeed, with the proposed specimen holder, it is possible to prepare semiconductor devices having a sensibly high package thickness (e.g., up to 1 cm), as well as naked chips having a sensible small thickness (e.g., lower than 100 µm).

Another advantage of the proposed specimen holder is given by the possibility of varying along the direction z the position of the holding portion 310 (and thus the semiconductor device 100) with respect to the position of the supporting portion 320 so as to allow the ion beam of the ion beam milling apparatus to be accurately centered on the semiconductor device 100. This can be done by loosening the set screw located in the threaded hole 318, sliding the holding portion along the dovetail guide 332, and then tightening again the set screw to constrain the holding portion 310 to the supporting portion 320 in the new position.

Figure 9B:
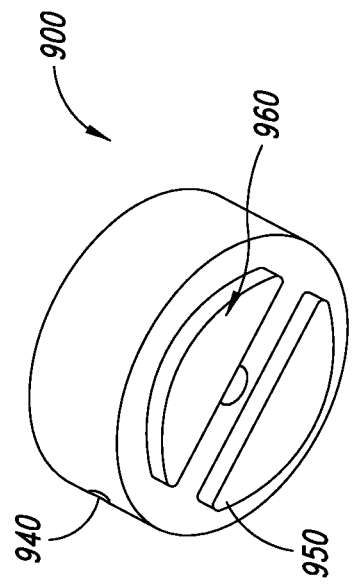
FIGS. 9A and 9B are perspective views of an adapter for the specimen holder of FIG. 3 according to an embodiment of the present disclosure.
Figure 9A:
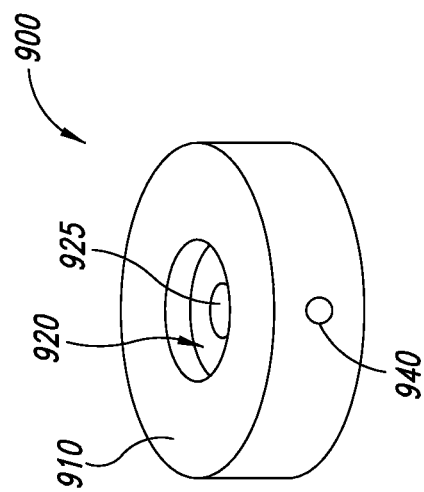

According to an embodiment of the present disclosure, the specimen holder 300 is configured to be fitted into an electron microscope through a corresponding adapter for microscope—identified in FIGS. 9A and 9B with the reference 900—, in such a way that, after the preparation operations have been completed, the semiconductor device 100 can be analyzed by the electron microscope without having to remove it from the specimen holder 300 itself.

FIGS. 9A and 9B illustrate the microscope adapter 900 from above and from below, respectively, according to an embodiment of the present disclosure.

The microscope adapter 900 has a substantially cylindrical shape, with a top face 910 centrally provided with a cylindrical cavity 920 having a diameter corresponding to the diameter of the base member 322 of the specimen holder 300; moreover, the bottom of such cylindrical cavity 920 is provided with a hole 925 adapted to receive the engaging element 326 of the specimen holder 300. The specimen holder 300 is housed in the microscope adapter 900 by fitting the engaging element 326 into the hole 925 and the base member 322 into the cylindrical cavity 920. A first threaded hole, identified in figures with the reference 940, is provided at the side surface of the microscope adapter 900 for housing a set screw adapted to constrain the specimen holder 300 to the adapter for microscope 900 when tightened. A second hole (not visible in the figures) is further provided at the side surface of the microscope adapter 900, for example symmetrically opposite to the first hole 940, for allowing the microscope adapter 900 to be grasped by automated handling devices (e.g., a mechanical arm) of the electron microscope. The microscope adapter 900 is preferably made of a low specific weight and high electric conductivity material, such as for example aluminum. The bottom face 950 of the microscope adapter 900 is provided with an engaging member 960 configured to fit into corresponding holding elements provided in the electronic microscope, so as to allow the microscope adapter 900 to be coupled to the microscope itself. For example, the engaging member 960 is made of brass.

After the sample preparation are terminated, the specimen holder 300—with the prepared semiconductor device 100 attached hereto—is inserted in the microscope adapter 900 by fitting the engaging element 326 into the hole 925 and the base member 322 into the cylindrical cavity 920. Therefore, the specimen holder 300 is constrained to the microscope adapter 900 by tightening the set screw housed in the hole 940. The specimen holder-adapter is then inserted in a pre-chamber of the electron microscope (not illustrated), by fitting the engaging member 960 into corresponding holding elements provided in the pre-chamber. After vacuum has been generated in the pre-chamber, the specimen holder-adapter assembly is grabbed by a mechanical arm that engages the second hole located at the side surface of the microscope adapter 900 and inserted in the main chamber of the electron microscope, wherein the semiconductor device 100 is analyzed by means of electron beams.

Therefore, since the semiconductor device has not to be removed from the specimen holder used to carry out the preparation operations in order to be reinserted in a new specimen holder (for the electron microscope), both displacement errors and tilt angle errors are avoided.

Moreover, thanks to the combined use of the proposed specimen holder and the proposed microscope adapter, charge effects are avoided during the analysis of the semiconductor device through the electron microscope, avoiding thus the requirement of carrying out preliminary sputtering processes on the semiconductor device.

Naturally, in order to satisfy local and specific requirements, a person skilled in the art may apply to the solution described above many logical and/or physical modifications and alterations.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microscope adapter, comprising:
 a specimen holder configured to hold a semiconductor device to be analyzed using an electron microscope, the specimen holder including:
  a holding portion including:
   a support configured to support the semiconductor device; and
   a first element coupled to the support; and a supporting portion that includes:
  a base element having a first side and a second side that is opposite to the first side, the first side being spaced from the second side in a first direction;
  a protruding engaging member at the first side of the base element, the protruding engaging member including one or more surfaces configured to engage with first and second sample preparation apparatuses during a sample preparation procedure and to the electron microscope; and
  a guide at the second side of the base element, the guide having walls that extend from the second side of the base element, the guide configured to vary a position of the holding portion with respect to the supporting portion and enable the first element of the holding portion to slide within the guide in a second direction that is perpendicular to the first direction; and
an adapter body configured to receive the protruding engaging member of the supporting portion and couple the specimen holder to a holding element of the electron microscope.

2. The specimen holder of claim 1, wherein the first element of the holding portion includes slanted engaging members configured to slide within the guide, the holding portion further including a second element extending perpendicularly to the first element from an edge of the first element, wherein the support is located on the second element.

3. The specimen holder of claim 2, wherein:
the first element and the second element have a substantially parallelepiped shape, and
the slanted engaging members are located on opposite free faces of the second element.

4. The specimen holder of claim 3, wherein:
the second element includes a first face, a second face on an opposite side of the second element from the first face, and a threaded hole extending completely through the second element between the first and second faces; and
a set screw configured to extend through the hole in the second element and to constrain the holding portion to the supporting portion.

5. The specimen holder of claim 1, wherein the protruding engaging member is cylindrical and is configured to fit into receptacles of said first and second sample preparation apparatuses.

6. The specimen holder of claim 1, wherein the protruding engaging member is cylindrical and is configured to engage with a target surfacing apparatus and a ion beam milling apparatus during the sample preparation procedure.

7. A microscope adapter, comprising:
a specimen holder including:
  a holding portion configured to support a semiconductor device; and
  a supporting portion that includes:
    a base element having a first side and a second side that is opposite to the first side, the first side being spaced from the second side in a first direction;
    a protruding engaging member at the first side of the base element, the protruding engaging member including a surface configured to engage with first and second sample preparation apparatuses during a sample preparation procedure; and
    a guide at the second side of the base element and coupled to the holding portion, the guide having walls that extend from the second side of the base element, the guide configured to vary a position of the holding portion with respect to the supporting portion and enable the holding portion to slide with respect to the guide in a second direction that is perpendicular to the first direction; and
an adapter body configured to receive the protruding engaging member of the supporting portion and couple the specimen holder to a holding element of an electron microscope.

8. The specimen holder of claim 7, wherein the holding portion includes slanted engaging members configured to slide within the guide.

9. The specimen holder of claim 7, wherein the holding portion includes:
a first element having slanted engaging members configured to slide within the guide, and
a second element extending perpendicularly to the first element from an edge of the first element, wherein the support is located on the second element.

10. The specimen holder of claim 9, wherein:
the second element includes a first face, a second face on an opposite side of the second element from the first face, and a threaded hole extending completely through the second element between the first and second faces; and
a set screw configured to extend through the hole in the second element and to constrain the holding portion to the supporting portion.

11. A microscope adapter, comprising:
a specimen holder configured to hold a semiconductor device to be analyzed using an electron microscope, the specimen holder including:
  a holding portion including:
    a support configured to support the semiconductor device, and
    engaging members; and
  a supporting portion that includes:
    a protruding engaging member; and
    a guide configured to enable the engaging members of the holding portion to slide within the guide and vary a position of the holding portion with respect to the supporting portion; and
an adapter body configured to receive the protruding engaging member of the supporting portion and couple the specimen holder to a holding element of the electron microscope.

12. The microscope adapter of claim 11, wherein the adapter body includes:
a top face provided with a hole configured to receive the protruding engaging member of the supporting portion; and
a bottom face provided with a further engaging member configured to engage with the holding element of the electron microscope.

13. The microscope adapter of claim 12, wherein the adapter body includes a side surface with a further threaded hole configured to house a set screw to constrain the specimen holder to the adapter body when the protruding engaging member of the specimen holder is in the hole.

14. The microscope adapter of claim 12, wherein the adapter body includes a side surface with a further threaded hole configured to enable the body to be grasped by automated handling devices of the electron microscope.

15. The microscope adapter of claim 11, wherein the holding portion includes:
a first element that includes the engaging members, and
a second element extending perpendicularly to the first element from an edge of the first element, wherein the support is located on the second element.

16. The microscope adapter of claim 15, wherein:
the first element and the second element have a substantially parallelepiped shape, and
the engaging members are located on opposite free faces of the second element.

17. The microscope adapter of claim 15, wherein:
the second element includes a first face, a second face on an opposite side of the second element from the first face, and a threaded hole extending completely through the second element between the first and second faces; and
a set screw configured to extend through the hole in the second element and to constrain the holding portion to the supporting portion.

18. The microscope adapter of claim 11, wherein the supporting portion further includes a base element having a first side and a second side that is opposite to the first side, the first side being spaced from the second side in a first direction, the protruding engaging member protruding from the first side of the base element, the guide having protruding guide members that extend from the second side of the base element, the guide configured to enable the engaging members of the holding portion to slide within the guide in a second direction that is perpendicular to the first direction.

* * * * *